United States Patent
Makikawa et al.

(10) Patent No.: US 6,436,728 B2
(45) Date of Patent: Aug. 20, 2002

(54) METHOD FOR MAKING AN OPTICAL WAVEGUIDE SUBSTRATE

(75) Inventors: Shinji Makikawa; Hiroshi Aoi; Masaaki Shirota, all of Annaka; Seiki Ejima, Kita-Gun, all of (JP)

(73) Assignee: Shin-Etsu Chemical Co., Ltd, Tokyo (JP)

( * ) Notice: Subject to any disclaimer, the term of this patent is extended or adjusted under 35 U.S.C. 154(b) by 0 days.

(21) Appl. No.: 09/836,272

(22) Filed: Apr. 18, 2001

(30) Foreign Application Priority Data

Apr. 21, 2000 (JP) ........................ 2000-120291

(51) Int. Cl.[7] ............................................. H01L 21/00
(52) U.S. Cl. ................... 438/31; 438/435; 438/773
(58) Field of Search ..................... 438/31, 435, 773, 438/592, 681

(56) References Cited

U.S. PATENT DOCUMENTS

| | | | | |
|---|---|---|---|---|
| 5,648,282 A | * | 7/1997 | Yoneda | 437/40 |
| 6,172,797 B1 | * | 1/2001 | Huibers | 359/291 |
| 6,177,373 B1 | * | 1/2001 | Sterte et al. | 502/4 |
| 6,218,268 B1 | * | 4/2001 | Xia et al. | 438/435 |
| 6,239,041 B1 | * | 5/2001 | Tanabe et al. | 438/773 |
| 6,251,758 B1 | * | 6/2001 | Chern et al. | 438/582 |
| 6,284,655 B1 | * | 9/2001 | Marsh | 438/681 |

* cited by examiner

*Primary Examiner*—John F. Niebling
*Assistant Examiner*—Olivia T Luk
(74) *Attorney, Agent, or Firm*—Oliff & Berridge, PLC

(57) ABSTRACT

A method of making a high quality optical waveguide substrate is provided, in which the surface of a silicon substrate is oxidized through relatively large thickness and no foreign matter particles are adhered on the surface thereof. The silicon substrate to form a quartz film for the optical waveguide is mounted on a carbon contained ceramics sample base and is inserted into a carbon contained ceramics furnace core tube of which its external circumference is arranged in a heating furnace. When the inside of the furnace core tube is heated to 200 to 600° C. by the heating furnace, an oxidant gas for the silicon substrate surface is introduced, then by further heating up to 1200 to 1350° C., the silicon surface is thus oxidized.

5 Claims, 2 Drawing Sheets

METHOD FOR MAKING AN OPTICAL WAVEGUIDE SUBSTRATE

BACKGROUND OF THE INVENTION

1. Field of Invention

The present invention relates to a method of making a high quality optical waveguide substrate of which the surface is oxidized from a silicon substrate through relatively large thickness and has no foreign matter particles adhered to the surface.

2. Description of Related Art

A waveguide device for optical communication is constituted of an optical waveguide and a semiconductor integrated circuit. The optical waveguide is formed on a quartz substrate. The quartz substrate is such that a quartz film, i.e. silicon dioxide, is formed on the surface of a silicon substrate. Since this film functions optically as an under-clad of the optical waveguide, it is required to be as thick as 5–30 $\mu$m.

On the other hand, the semiconductor integrated circuit is formed on a silicon substrate. A thickness of an oxidation film required for the semiconductor integrated circuit is 0.2–3 $\mu$m, which is much thinner than the quartz film for the optical waveguide.

Since silicon constituting a substrate has strong affinity with oxygen and is easily oxidized. a technique to form a quartz film by oxidation on the silicon surface of the substrate is adopted as a method for forming such oxidation film of the semiconductor integrated circuit and quartz film of the optical waveguide.

Such techniques are, for example, dry oxygen oxidation method, wet oxidation method, steam oxidation method, hydrogen burning oxidation method and hydrochloride oxidation method. The wet oxidation method, the steam oxidation method and the hydrogen burning oxidation method are able to form a quartz film through oxidation of the silicon surface by applying high reaction property oxygen generated by thermal decomposition of steam, in which the silicon substrate placed on a carbon contained ceramics sample base inside a high thermal resistance carbon contained ceramics furnace core tube is heated to a high temperature while in contact with steam. Oxidation rates of those methods are relatively high.

FIG. 2 shows the relationship between the thickness of the oxidation film and the oxidation time when oxidizing the silicon surface in the steam oxidation method, relative to various oxidation temperatures, i.e. heating temperatures of the silicon surface. As seen in FIG. 2, to form an quartz film of 0.2 to 3 $\mu$m using for a semiconductor integrated circuit, it takes 10 to 1000 minutes at 1200° C. Usually, to obtain such homogeneous thin quartz film formed in a short time, the silicon substrate is exposed to inert gas atmosphere while heating temperature is raised to the oxidation temperature. Once it reaches the oxidation temperature the silicon substrate is in contact with steam.

If the quartz film of 10 to 25 $\mu$m generally used for optical waveguide is to be formed in the same manner, it takes 20000 to 125000 minutes at 1200° C., which is a considerable amount of time. It is at this point that foreign matter particles adhere to the surface of the quartz substrate. Such foreign matter particles amplified through an electron microscope can be observed as a brown needle like foreign matter.

The development mechanism of the particle is assumed as follows. For instance, if a sample base or a furnace core tube made of silicon carbide is used, the silicon carbide on the surface of the sample base exposed to high temperature for a long time may be partially oxidized and form a quartz film having a thickness of several microns. When the sample base, for instance, is repeatedly used and is exposed to inert gas atmosphere at a high temperature, the silicon carbide inside operates as a reducer to the quartz film and SiO having a subliming property will generate as shown in the following chemical formula:

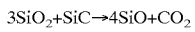

$$3SiO_2 + SiC \rightarrow 4SiO + CO_2$$

It is assumed that the SiO, after being sublimated and scattered, adhered to the surface of the silicon substrate and was gradually grown to become foreign matters. Since such consequence attributes to the reductive action by carbon, same results may be obtained in general when using ceramics containing carbon as a sample base or a furnace core tube.

The adhered foreign matter particles may become optical diffusion spots, or cause optical loss, and consequently, may not only degrade the performance of the optical waveguide substrate but also make poor yield.

SUMMARY OF THE INVENTION

The object of the present invention developed to solve the foregoing problem, is to provide a method of making a high quality optical waveguide substrate, in which the surface of the silicon substrate is oxidized through relatively large thickness and is free from any foreign matter particles adhering on its surface.

The method of making an optical waveguide substrate according to the present invention, developed to achieve the foregoing object, is such that a silicon substrate to form a quartz film for optical waveguide is placed on a carbon contained ceramics sample base and is inserted into a furnace core tube made of carbon contained ceramics, of which a heating furnace is arranged to its exterior, and an oxidant gas for the silicon surface of the silicon substrate is introduced into the furnace core tube which is heated up to 1200 to 1350° C. by the heating furnace to thus oxidize the silicon surface. It begins to introduce the oxidant gas into the furnace core tube while increasing the temperature to from 1200 to 1350° C.

It is preferable to begin introducing the oxidant gas into the furnace core tube when the inside of the furnace core tube is heated to 200 to 600° C. as the temperature is increased.

During the introduction of the oxidant gas, if the temperature of the furnace core tube is less than 200° C., foreign matter particles may easily adhere to the silicon substrate by, for instance, static electricity, while if the temperature is higher than 600° C., the reaction as in the afore mentioned chemical formula may occur.

In order to oxidize the silicon surface, if the temperature of the furnace core tube is less than 1200° C., it takes long to form a thick quartz film, thus is inefficient. If the temperature is higher than 1350° C., defects such as slips tend to occur in the silicon substrate.

The termination of the oxidation of the silicon surface is preferably implemented by continuously introducing the oxidant gas until the temperature inside the furnace core tube is dropped to 200 to 600° C. The introduction of the gas is terminated after the temperature inside the furnace core tube is cooled to the above temperature.

It is preferred that the oxidant gas comprises steam or oxygen. It is possible to introduce a simple substance of steam into the furnace core tube, or generate steam by introducing oxygen gas and hydrogen gas into the furnace core tube. Moist oxygen gas or high-pressure oxygen that has gone under high partial pressure may be introduced as well.

It is preferably implemented that the ceramics containing carbon is a silicon carbide.

According to this method, when the furnace core tube is at high temperature, the inside thereof is filled with oxidant gas. Under this oxidant gas atmosphere, carbon contained in the ceramics constituting the furnace core tube and the sample base is restrained from acting as a reducer. As a result, the reduction reaction shown in the foregoing chemical formula hardly happens, therefore, no SiO is produced, and consequently, no foreign matter particles adhere to the surface of the silicon substrate.

DETAILED DESCRIPTION OF PREFERRED EMBODIMENTS

Preferred embodiments applied the present invention will be explained below with reference to the drawings but the scope of the claimed invention is not limited the embodiments.

Figure 1:
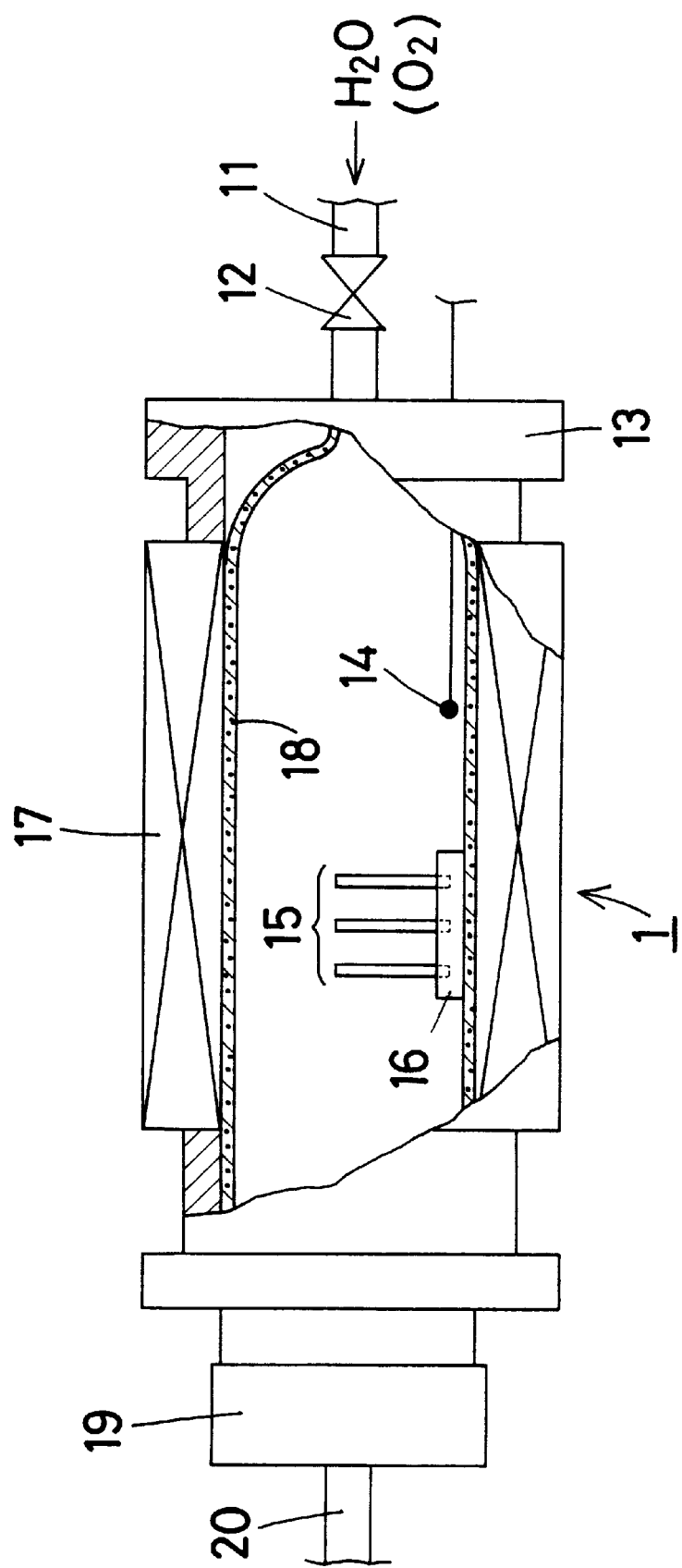
FIG. 1 is a cross sectional view showing a device used to carry out the method for making of the optical waveguide substrate according to the present invention.
Figure 2:
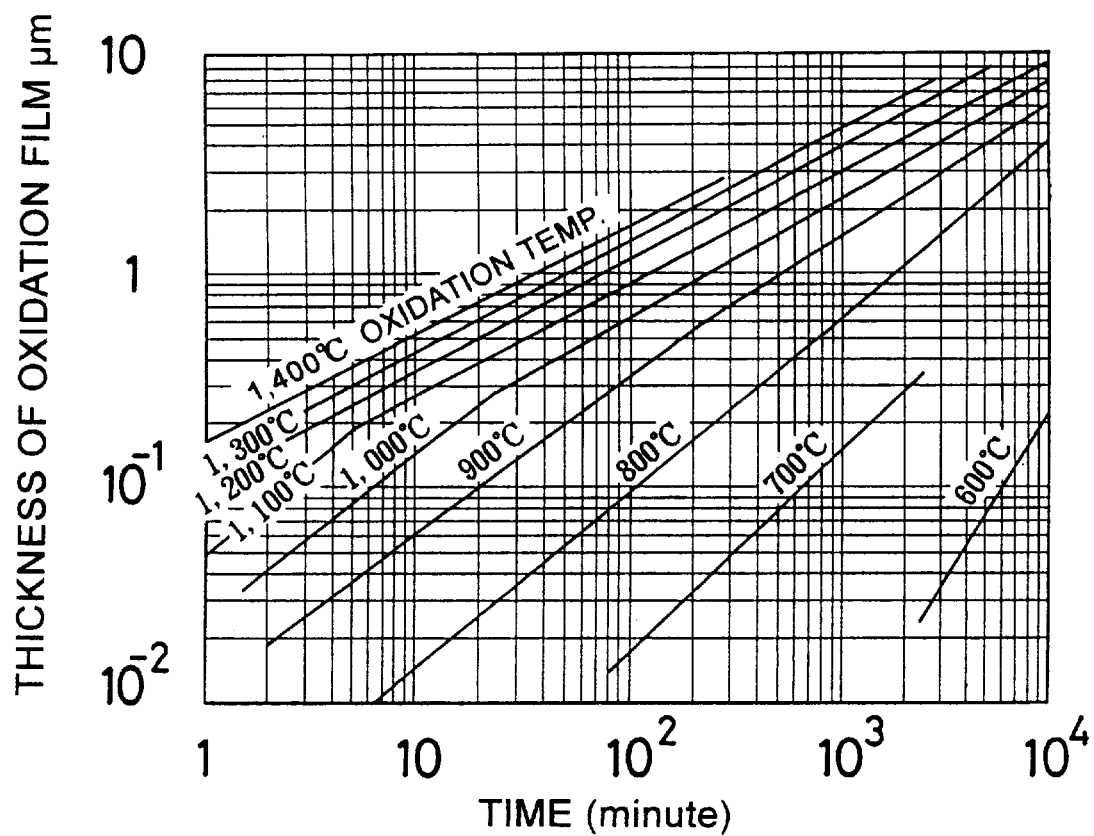
FIG. 2 is a graph showing the relationship between the thickness of the oxidation film and the oxidation time regarding various oxidation temperatures in the steam oxidation method.

FIG. 1 shows a schematic diagram of a making device 1, which is used when carrying out the making method of the optical waveguide substrate according to the present invention.

The device 1 for making the optical waveguide substrate oxidizes the silicon surface of the silicon substrate 15, which forms a quartz film for the optical waveguide. This making device 1 consists of a furnace core tube 18 made of silicon carbide and its outer surface arranged with a heating furnace 17. It is possible to apply a silicon carbide film having a thickness of some 1m by chemical vapor deposition to the inner surface of the furnace core tube 18. One end of the furnace core tube 18 is roughly sealed up and is connected to a gas introduction tube 11, which oxidizes the silicon surface of the silicon substrate 15. A switch valve 12 to control the introduction of gas is arranged en route to the gas introduction tube 11. A lid 19, which is attached to an air release pipe 20, covers the other end of the furnace core tube 18. A temperature sensor 14 made of thermo-couple is arranged inside the furnace core tube 18. The temperature sensor 14 is connected to a temperature indication device (not shown in the drawings). A sample base 16 made of silicon carbide has many slitting grooves. The silicon substrate 15, which is inserted in the slitting grooves of the sample base 16, is inserted in the furnace core tube 18. The furnace core tube 18 is inserted in a container 13.

By using the device 1, the optical waveguide substrate is made as follows.

A number of silicon substrates 15, made of silicon and shaped in circular plates, are placed in equal spacing on the sample base 16. The sample base 16 is inserted into the furnace core tube 18 from its opened end, and is covered by the lid 19.

The furnace core tube 18 is slowly heated by the heating furnace 17. The switch valve 12 is closed until the inside temperature of the furnace core tube 18 reaches a fixed temperature in the range of 200 to 600° C. When the inside temperature of the furnace core tube 18 detected by the temperature sensor 14 reaches the fixed temperature. the switch valve 12 opens and oxidant gas is introduced into the furnace core tube 18. Heating continues until the inside temperature of the furnace core tube 18 reaches 1200 to 1350° C. It is kept at this temperature while the introduction of the oxidant gas continues. The silicon surface of the silicon substrate 15 is oxidized by an oxidant gas, such as oxygen, to form a quartz film shown in the chemical formula; $Si+O_2 \rightarrow SiO_2$.

When terminating the oxidation, the furnace core tube 18 is slowly cooled. As the inside temperature of the furnace core tube 18 is dropped to the fixed temperature within the range of 200 to 600° C. the introduction of the oxidant gas is stopped. Sample board 16 is drawn out, and an optical waveguide substrate, which both surfaces of the silicon substrate are formed with quartz films, is obtained.

The experimental embodiments of the optical waveguide substrate made by the method according to the present invention will be described below in embodiments 1 and 2. Experimental embodiments of the optical waveguide substrate made by a method other than the present invention is described in the comparative example.

EMBODIMENT 1

The external circumference of a circular plate shaped silicon substrate 15, which is 4 inches in diameter and is 0.6 mm thick, is partially scraped flat. The flat portions are faced downwards and three plates of the silicon substrate 15 thereof are inserted in the groove on sample base 16 in equal spacing. The sample base 16 made of silicon carbide is inserted in the furnace core tube 18, which has a diameter of 200 mm and is made of silicon carbide, then is covered by a lid 19, which has an air release pipe 20. The external circumference of the furnace core tube 18 is arranged with a heating furnace 17, which assumes a tube shaped furnace of a kanthal heater, Kanthal AMP240φ (Trade name code by Kanthal Corporation). A switch valve 12 arranged en route to the gas introduction tube 11, which is connected to a quartz container (not shown in diagram) and generates steam by boiling pure water, is closed.

The furnace core tube 18 is heated gradually by a heating rate of 3° C. per minute to prevent the furnace core tube from breaking due to sudden change in temperature. As the inside temperature of the furnace core tube 18 reaches 500° C. the switch valve 12 is opened and 3L per minute of steam is introduced to the furnace core tube 18. Heating continues until the inside temperature of the furnace core tube 18 reaches 1250° C. It is kept at this temperature for 5000 minutes while the introduction of the steam continues, and the silicon surface of the silicon substrate 15 is oxidized.

After 5000 minutes, the furnace core tube 18 is cooled at a cooling rate of 3° C. per minute. As the temperature inside the furnace core tube 18 is dropped to 500° C., the introduction of the oxidant gas is stopped. Sample board 16 is drawn out, and an optical waveguide substrate, which both surfaces of the silicon substrate 15 are formed with quartz films having the desired thickness of 5.1 m, is obtained.

When the surface was measured by a foreign matter examining device (provided from Hitachi Engineering Corporation), it was found that the number of foreign matter particles larger than 0.3 μm was as small as less than 100 pieces on average per substrate.

EMBODIMENT 2

An optical waveguide substrate was experimentally made with the same device as in embodiment 1, except for that a gas introduction tube connected to an oxygen gas bomb and a hydrogen gas bomb was used instead of a gas introduction tube connected to a quartz container, which generates stream.

First, the furnace core tube 18 is heated gradually by a heating rate of 3° C. per minute. As the temperature inside the furnace core tube 18 reaches 500° C., the switch valve 12 is opened and, by adjusting the regulator of the oxygen gas bomb, 1L per minute of oxygen gas is introduced to the furnace core tube 18. As the inner tube temperature reaches 800° C., the regulator of the hydrogen gas bomb is adjusted and 1.8L per minute of hydrogen gas is introduced. At temperatures higher than 800° C., oxygen gas and hydrogen gas react together and generate steam. Further heating continues until the temperature inside the furnace core tube 18 reaches 1250° C. It is kept at this temperature for 5000 minutes while steam continues to generate, and the silicon surface of the silicon substrate 15 is oxidized.

After 5000 minutes, the introduction of hydrogen gas is stopped and while 1L per minute of oxygen gas is introduced, the furnace core tube 18 is cooled at a cooling rate of 3° C. per minute. When the temperature inside the furnace core tube 18 is dropped to 500° C., the introduction of the oxidant gas is stopped.

An optical waveguide substrate, which both surfaces of the silicon substrate are formed with quartz films having the desired thickness of 5.0 $\mu$m, is obtained. When the surfaces were measured by the foreign matter examining device, it was found that the number of foreign matter particles larger than 0.3 $\mu$m was as small as less than 50 pieces on average per substrate.

COMPARATIVE EXAMPLE

An optical waveguide substrate was experimentally made in the same way as in embodiment 1, except for that during the process of heating or cooling where the inner tube temperature of the furnace core tube ranges between 500 to 1250° C., 1L per minute of nitrogen gas, which is an inert gas, was introduced instead of the introduction of steam. An optical waveguide substrate, which has a thickness of 4.8 $\mu$m of quartz film formed on both surfaces of the silicon substrate, was obtained. When the surfaces were measured by a foreign matter examining device, it was found that the number of foreign matter particles larger than 0.3 $\mu$m was as many as 400 pieces on average per substrate.

As has been described in detail, according to the method of making an optical waveguide substrate of the present invention, it is possible to obtain a high quality optical waveguide substrate, in which the surface of its silicon substrate is oxidized through relatively large thickness and has no foreign matter particles adhered on its surface.

Usage of the present optical waveguide substrate allows formation of an optical waveguide device of excellent performance.

What is claimed is:

1. A method for making an optical waveguide substrate, comprising:
   - mounting a silicon substrate on a carbon-containing ceramic sample base;
   - inserting the silicon substrate and the sample base into a carbon-containing ceramic core tube, wherein a heating furnace is arranged around the circumference of the core tube; and
   - oxidizing the silicon substrate with an oxidation gas by introducing the oxidation gas to the core tube while heating the core tube to a temperature of from 1200° C. to 1350° C.

2. The method of claim 1, wherein introducing the oxidation gas occurs when the core tube has reached a temperature of from 200° C. to 600° C.

3. The method of claim 1, wherein introducing the oxidation gas is continued after heating the core tube to the temperature of from 1200° C. to 1350° C., until the core tube has cooled to a temperature of from 200° C. to 600° C.

4. The method of claim 1, wherein the oxidation gas comprises at least one gas selected from oxygen and steam.

5. The method of claim 1, wherein the sample base and the core tube are each comprised of SiC.

* * * * *